United States Patent
Nekarda et al.

(10) Patent No.: US 11,588,070 B2
(45) Date of Patent: Feb. 21, 2023

(54) METHOD FOR PRODUCING A PHOTOVOLTAIC SOLAR CELL, PHOTOVOLTAIC SOLAR CELL AND PHOTOVOLTAIC MODULE

(71) Applicant: Fraunhofer-Gesellschaft zur Forderung der Angewandten Forschung E.V., Munich (DE)

(72) Inventors: Jan Nekarda, Freiburg (DE); Andreas Brand, Freiburg (DE); Martin Graf, Freiburg (DE); Angela De Rose, Freiburg (DE); Achim Kraft, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 156 days.

(21) Appl. No.: 16/979,327

(22) PCT Filed: Mar. 8, 2019

(86) PCT No.: PCT/EP2019/055819
§ 371 (c)(1),
(2) Date: Sep. 9, 2020

(87) PCT Pub. No.: WO2019/170849
PCT Pub. Date: Sep. 12, 2019

(65) Prior Publication Data
US 2021/0005773 A1    Jan. 7, 2021

(30) Foreign Application Priority Data
Mar. 9, 2018    (DE) .................. 102018105472.6

(51) Int. Cl.
*H01L 31/18* (2006.01)
*H01L 31/05* (2014.01)

(52) U.S. Cl.
CPC ........ *H01L 31/186* (2013.01); *H01L 31/0516* (2013.01)

(58) Field of Classification Search
CPC ............. H01L 31/022441; H01L 31/05; H01L 31/0504; H01L 31/0516; H01L 31/0682; H01L 31/186
See application file for complete search history.

(56) References Cited

U.S. PATENT DOCUMENTS

2010/0089435 A1*  4/2010  Lockenhoff ......... H01L 31/0687
                                                    136/246
2014/0366928 A1* 12/2014  Niinobe .......... H01L 31/022441
                                                    136/246
(Continued)

FOREIGN PATENT DOCUMENTS

DE    102010039563    2/2012
DE    102016115355    2/2018
(Continued)

OTHER PUBLICATIONS

Machine translation of EP-2629339-A1, Waegli P. (Year: 2013).*

*Primary Examiner* — Mayla Gonzalez Ramos
(74) *Attorney, Agent, or Firm* — Volpe Koenig

(57) ABSTRACT

A method for producing a photovoltaic solar cell, including the method steps: A. providing at least one solar cell precursor having at least one base and at least one emitter; B. providing a metal film on a back side of the solar cell precursor, so that the metal film is electrically conductively connected to the base or the emitter, the metal film being formed as an integral component of the back side contact and the solar cell being terminated on the back side. The at least one cell connection region on at least one side of the metal film overhangs the edge of the solar cell precursor by at least 1 mm, preferably by at least 3 mm.

8 Claims, 5 Drawing Sheets

(56) References Cited

U.S. PATENT DOCUMENTS

| | | |
|---|---|---|
| 2016/0087119 A1 | 3/2016 | Pass |
| 2016/0093757 A1* | 3/2016 | Pass ........................ H01L 31/18 228/179.1 |
| 2017/0012156 A1* | 1/2017 | Lim ....................... H01L 31/049 |
| 2018/0108796 A1* | 4/2018 | Heng .................... H01L 31/074 |

FOREIGN PATENT DOCUMENTS

| | | | |
|---|---|---|---|
| EP | 2629339 | 8/2013 | |
| EP | 2629339 A1 * | 8/2013 | ......... H01L 31/0504 |
| JP | 2015019049 | 1/2015 | |
| WO | 2016049092 | 3/2016 | |

* cited by examiner

METHOD FOR PRODUCING A PHOTOVOLTAIC SOLAR CELL, PHOTOVOLTAIC SOLAR CELL AND PHOTOVOLTAIC MODULE

TECHNICAL FIELD

The invention relates to a method for producing a photovoltaic solar cell, to a photovoltaic solar cell, and to a photovoltaic module.

BACKGROUND

Photovoltaic solar cells typically have, at a front side facing the light incidence during use, gridlike metallization structures for contacting the emitter and, at a back side, whole-area metal layers for contacting the base of the solar cell. In a photovoltaic module, solar cells situated next to one another are typically connected in series by the back-side metallic contacting structure of a solar cell being electrically conductively connected to the front-side metallic contacting structure of an adjacent solar cell by a cell connector.

Metallic elements are typically used as cell connector, said metallic elements being arranged in each case between adjacent solar cells during the creation of the photovoltaic module. EP 2 629 339 A1 likewise discloses the use of a foil comprising a metallic layer, an insulation layer and a partly optically transparent region as cell connector.

BACKGROUND

The present invention is based on the object of providing a cost-effective interconnection of photovoltaic solar cells having improved mechanical properties.

This object is achieved by a method for producing a photovoltaic solar cell, a photovoltaic solar cell and a photovoltaic module having one or more features described herein. Advantageous configurations are found below and in the claims.

The photovoltaic solar cell according to the invention is preferably formed by the method according to the invention, in particular a preferred embodiment thereof. The method according to the invention is preferably formed for producing a photovoltaic solar cell according to the invention, in particular a preferred embodiment thereof.

The method according to the invention for producing a photovoltaic solar cell comprises a method step A, comprising providing at least one solar cell precursor having at least one base and at least one emitter, and a method step B comprising arranging a metal foil (also abbreviated hereinafter to "foil") at a back side of the solar cell precursor, such that the metal foil is electrically conductively connected to the base or the emitter.

In this case, the metal foil is formed as an integral part of the back-side contacting of the photovoltaic solar cell. Furthermore, the metal foil terminates the back side of the solar cell.

What is essential is that the metal foil projects beyond the edge of the solar cell precursor with at least one cell connection region at at least one side by at least 200 μm, preferably by at least 1 mm, in particular by at least 3 mm.

It is already known to carry out the back-side contacting of a solar cell by a metal foil. Such a solar cell and such a method are known from DE 10 2016 115 355 A1, for example. The metal foil constitutes an integral part of the photovoltaic solar cell in order to ensure that charge carriers of the solar cell are carried away at the back side. Consequently, with regard to its main function, the metal foil corresponds to the otherwise customary whole-area back-side metallization of a photovoltaic solar cell by a metal layer.

In the method according to the invention, the metal foil overlaps the solar cell at at least one edge by at least 1 mm, preferably by at least 3 mm, more preferably by at least 5 mm. By way of this cell connection region, the solar cell can thus be electrically conductively connected to an adjacent solar cell more simply and in a cost-effective manner. The cell connection region of the back-side metal foil thus wholly or at least partly performs the function of the otherwise customary, separate cell connectors.

The present invention thus constitutes a further development of the previously known back-side metallic contacting structure of a photovoltaic solar cell using a metal foil, wherein at least one cell connection region of the metal foil is used as a cell connector or at least part of a cell connector to be coiled.

This affords considerable cost advantages. Furthermore, it is possible to have recourse to connection methods known per se in the case of solar cell modules, however, on account of the flexibility of the metal foil. In particular, it is possible to use standard structures of solar cells known per se, in which the back side of a solar cell is electrically conductively connected to the front side of an adjacent solar cell in order to form a series circuit.

In contrast to previously known methods, an external cell connector is thus not absolutely necessary for this. Furthermore, no special requirements are made of the construction or the structure of the metal foil. Advantageously, a monolayer metal foil is therefore used. In particular, it is advantageous to use an unstructured metal foil, in particular an unstructured monolayer metal foil. This affords cost advantages since a cost-effective metal foil can be used and, moreover, the handling in the process is also simplified by comparison with multilayer foils or structured foils. By comparison with previously known cell connectors, the metal foil is also mechanically more stable since it is flexible and less rigid.

Advantageously, the metal foil projects beyond the edge of the solar cell precursor at exactly one side. As a result, at this edge it is possible to form the connection to an adjacent solar cell by the cell connection region of the metal foil and, at the other edges, the module arrangement is not adversely affected by projecting foil.

Advantageously, the metal foil is electrically conductively connected to the solar cell precursor via a plurality of point contacts. Firstly, low series resistance losses and, secondly, an increased mechanical adhesion of the metal foil are realized by this means.

In particular, it is advantageous that at least one electrically insulating insulation layer is arranged between metal foil and solar cell precursor, said insulation layer having a plurality of openings, at each of which an electrically conductive connection between metal foil and solar cell precursor is formed. The insulation layer prevents the metal foil from being electrically conductively connected to a semiconductor layer of the solar cell in an uncontrolled manner outside the region of the point contacts, and undesired side effects such as increased recombination or short circuits are avoided as a result.

Advantageously, the plurality of point contacts are electrically conductively connected to one another outside the solar cell precursor exclusively via the metal foil. In order to reduce costs and simplify the production method, it is advantageous that no additional metallic connection structures for an electrical connection of the point contacts among one another, apart from the metal foil, are provided. In one advantageous embodiment, the metal foil completely covers the back side of the solar cell precursor. As a result, firstly, a low series resistance is achieved and, secondly, the effect of an optically specularly reflective back side on account of the specular reflection of radiation at the side of the metal foil facing the solar cell precursor is optimally utilized as a result and, consequently, the light absorption and hence the efficiency of the solar cell are increased.

In an alternative embodiment, the metal foil is arranged in a manner omitting a connection edge region of the back side, in particular a connection edge region having a width in the range of 50 µm to 1 cm. In this advantageous embodiment, an electrical contacting possibility for the opposite polarity can be provided in the connection edge region. Preferably a semiconductor layer of the photovoltaic solar cell at the back side or near the back side is electrically conductively contacted by the metal foil. In particular, it is advantageous for a base of the solar cell to be electrically conductively contacted by the metal foil. The connection edge region, at which the metal foil is omitted in this advantageous embodiment, can thus be used for the electrical contacting of the opposite polarity. In particular, it is advantageous for an emitter of the solar cell to be electrically conductively contacted at the connection edge region.

It is within the scope of the invention to form marginally an electrically conductive connection from the front side to the connection edge region of the back side. Such an electrically conductive connection can be configured in a metallic connection element at the edge of the solar cell. It is likewise within the scope of the invention to lead an emitter region arranged at the front side through emitter channels from the front side to the back side and to electrically conductively contact them at the back side in the connection edge region. Such structures are known as EWT structures (Emitter Wrap Through).

In order to avoid series resistance losses particularly within emitter channels, it is advantageous, however, to provide a metallic electrically conductive connection from the front side to the back side: in one advantageous configuration, at least one metallic through connection, preferably a plurality of metallic through connections, from a front side to the back side of the solar cell precursor is formed in the connection edge region, which is not covered by the metal foil. By means of these metallic through connections, charge carriers can thus be guided from the front side to the back side in order to be carried away at the back side. In particular, it is advantageous for an emitter arranged at the front side to be electrically conductively contacted by the metallic through connections. The photovoltaic solar cell is thus preferably formed as an MWT solar cell (Metal Wrap Through).

This advantageous configuration does have the disadvantage that a standard solar cell structure is not used. In return, however, there is the advantage that an interconnection of solar cells in series in a solar cell module is made possible exclusively by a back-side interconnection: advantageously, in a solar cell module the solar cells are juxtaposed in such a way that in each case a cell connection region of a solar cell faces the connection edge region of an adjacent solar cell. As a result, in an uncomplicated manner, the cell connection region of the metal foil can be arranged below the connection edge region of the adjacent solar cell and can be mechanically and electrically conductively connected thereto, such that a series interconnection is obtained.

In one advantageous embodiment, the cell connection region is formed with at least one elongate contacting finger extension at the side of the cell connection region facing away from the solar cell precursor, in particular a contacting finger extension with a width of less than 2 mm and a length of greater than 1 mm. The contacting finger extension can advantageously be led to the front side of an adjacent solar cell in the case of series interconnection in a photovoltaic module. Advantageously, the solar cell therefore has, on the front side, a metallic contacting structure, in particular a busbar, extending along the contacting finger extension and the contacting finger extension is arranged on this metallic contacting structure of the adjacent solar cell and is electrically conductively and mechanically connected thereto in order to obtain a series interconnection in the photovoltaic module.

The object mentioned in the introduction is furthermore achieved by a method for producing a solar module. This method comprises a method step A comprising producing a plurality of solar cells according to the invention, in particular in accordance with an advantageous embodiment. Furthermore, a method step B involves juxtaposing at least two such solar cells and electrically connecting the solar cells by the cell connection region of the metal foil of a solar cell being electrically conductively connected to the adjacent solar cell.

Advantageously, in this case, the cell connection region of the metal foil is led onto the front side of the adjacent solar cell and there is electrically conductively connected to the adjacent solar cell. As a result, it is possible to have recourse to solar cell structures known per se, in particular solar cell structures having a front-side emitter and a front-side metallic contacting structure for the emitter. In one preferred embodiment, particularly in the case of standard solar cells having an edge length of 156 mm, the front-side electrode should be designed in an appropriately reinforced manner in order to produce an excessively large series resistance losses. To that end, in one preferred embodiment, the busbars are printed or dispensed with greater thickness or else busbars are specially produced by metal spraying methods, for example, or the number of busbars is increased.

In an alternative advantageous embodiment, the solar cell, at the back side, are formed in each case with a connection edge region not covered by metal foil, in particular preferably as described above, and are juxtaposed in such a way that in each case a cell connection region of the metal foil of a solar cell overlaps the connection edge region of the adjacent solar cell and there the cell connection region is electrically conductively connected to the connection edge region.

In a further advantageous embodiment, at least one cell connector which is electrically conductively connected to the solar cell is arranged at the front side of the solar cell, said cell connector overlapping the solar cell by at least 1 mm at least at an edge in a cell connector overlap region, and the cell connection region of the metal foil of a solar cell is electrically conductively connected to the cell connector overlap region of the adjacent solar cell, in particular preferably by soldering or welding. In this advantageous embodiment, the cell connection region of the metal foil thus partly replaces the cell connector. This affords the advantage that, in comparison with the present-day standard design, 50% of the cell connector length can be saved since said cell connector now only covers the front side of the solar cell but no longer extends over the entire back side. Furthermore, the foil is significantly more flexible than the relatively rigid, approximately 200 µm thick copper connector, such that the flexible connection by foil reduces the mechanical stresses between the cells that occur in the module during daily use. A further advantage is that local welding or hard soldering processes can be employed in the cell intermediate region, which processes result in stabler connections of the two materials and have a lower electrical resistance. That is not possible in the case of conventional soldering processes since the soldering process takes place on the cell and the latter is heated globally for this purpose, for which reason exclusively soft soldering processes up to temperatures of <300 degrees can be used.

The object mentioned in the introduction is furthermore achieved by a photovoltaic solar cell having one or more features described herein. The photovoltaic solar cell comprises a semiconductor substrate and a metallic back-side contacting with a metal foil, wherein the metal foil terminates the solar cell at the back side.

What is essential is that the metal foil, in a cell connection region projects beyond the semiconductor substrate at at least one edge by at least 1 mm, preferably at least 3 mm.

In this case, the solar cell is preferably produced in accordance with DE 10 2016 115 355 A1, but additionally comprises the cell connection region described above.

Advantageously, the metal foil is connected to the semiconductor substrate at a plurality of point contacts, and outside the semiconductor substrate the point contacts are electrically conductively connected to one another exclusively via the metal foil. This affords cost advantages since there is no need to form additional metallic contacting structures for back-side contacting by the metal foil.

In this case, it is within the scope of the invention that the metal of the metal foil is used directly for contacting a semiconductor layer of the photovoltaic solar cell. It is likewise within the scope of the invention that, during the production of the solar cell, firstly separate metallic point contacts are formed and then the metal foil is electrically conductively connected to the point contacts, in particular by local fusion.

It is particularly advantageous that a heterocontact structure comprising a heterojunction layer and a dielectric tunnel layer arranged indirectly or preferably directly between heterojunction layer and semiconductor substrate is arranged at the back side of the semiconductor substrate, and that the metal layer is electrically conductively connected to the heterojunction layer. As a result, a highly efficient and nevertheless cost-effective photovoltaic solar cell can be achieved since, firstly, a low effective back-side recombination rate can be achieved by way of the heterojunction layer and, secondly, the contacting with the metal foil enables a cost-effective contacting which, moreover, requires no or only little heat input for production, such that the heterojunction layer is not adversely affected, or is adversely affected slightly at most, on account of the heat input.

The object stated in the introduction is furthermore achieved by a photovoltaic module having one or more of the features described herein, comprising a plurality of juxtaposed and electrically conductively connected solar cells. What is essential is that the back side of a solar cell is electrically conductively connected to the front side of the adjacent solar cell by a metal foil arranged at a back side of the solar cell, said metal foil being an integral part of the back-side contacting of said solar cell.

The method according to the invention is suitable in particular for forming an expansion reserve between the solar cells:

In one advantageous embodiment, a solar cell module is produced by method steps A and B mentioned above. After method step B the two solar cells are brought close together in order to form an expansion reserve by the cell connection region. The two solar cells are thus brought closer together in such a way that the distance between the solar cells that is bridged by the cell connection region can be shortened and, as a result, a curvature and/or folding in the cell connection region can form in the cell connection region between the solar cells. This curvature and/or folding of the cell connection region thus enables an expansion reserve if a change in distance between the solar cells takes place in the solar cell module for example on account of temperature fluctuations or mechanical loading as a result of snow load or wind. Advantageously, the solar cells are brought closer together by a distance in the range of 100 μm to 300 μm.

The method according to the invention is suitable particularly for narrow solar cells, so-called "half-cells", since a possible lower transverse conductivity of the foil in comparison with cell connector ribbons here causes lower losses in efficiency. Advantageously, therefore, the solar cell, perpendicular to the edge of the cell connection region, have a width of less than 10 cm, in particular less than 6 cm, preferably less than 3 cm.

The method according to the invention is suitable in particular for shingle solar cells, particularly if the latter, in a further preferred embodiment, are of a size typical of shingle solar cells, which is again significantly smaller than half-cells. The amount of electricity generated is thus lower and the resistance contribution is significantly smaller on account of the limited conductivity in the case of thin foils. Since this type of module construction exhibits no cell interspaces at all, possibly even a foil overhang is sufficient which is just wide enough that the foil can still be secured to the neighboring cell. A further advantage is that standard cell connectors, on account of their stiffness, cannot be employed for interconnection in shingle modules and only adhesive bonding by expensive conductive adhesive remains as the sole connection technology. Thin foils, on account of their flexibility, can be shaped to such a great extent that even shingle solar cell are thereby able to be electrically connected.

In one advantageous embodiment of the method for producing a photovoltaic module, method steps A and B are carried out as described above. Afterward, the solar cell whose metal foil was used for connecting the two solar cells is raised and placed onto the edge of the adjacent solar cell, such that in a plan view from above the solar cell covers, preferably completely covers, the metal foil. A shingle arrangement of solar cells which enables a high module efficiency is realized as a result. At the same time, the cells are mechanically non-rigidly connected to one another, which significantly improves the module durability.

The metal foil preferably has a thickness in the range of 6 μm to 40 μm. This affords an optimization between flexibility and conductivity.

The metal foil is preferably formed as an aluminum foil.

In one advantageous development of the method, at least one, preferably exactly one, electrically conductive cross-connector is electrically conductively connected to the cell connection region. This affords the advantage that for interconnecting the solar cell in a module, a cell connector of the adjacent solar cell, in particular an electrically conductive so-called cell connector ribbon, can be led from the front side of the adjacent solar cell to the cross-connector and can be electrically conductively connected thereto, preferably by soldering.

The additional provision of a cross-connector in this case has the advantage that with regard to the type of material and also the material thickness it is possible to optimize the cross-connector for forming a soldering connection to the cell connector with respect to the adjacent solar cell, in particular a cell connector ribbon. The cross-connector preferably has an elongate shape, in particular a parallelepipedal shape, and preferably extends parallel to the edge of the solar cell precursor at which the cell connection region of the metal foil is arranged. Preferably, the cross-connector is at a distance from the edge of the solar cell precursor, such that it does not touch the latter, in order to maintain the flexibility of the metal foil and also to avoid impairment of the solar cell precursor during the soldering process, in particular of semiconductor material of the solar cell precursor.

The cross-connector is preferably formed as a metallic cross-connector, in particular preferably composed of one or more of the materials aluminum or copper; the cross-connector preferably has a copper proportion of at least 50%, preferably at least 80% (in each case percent by mass); in particular, the cross-connector is preferably formed from copper. Advantageously, the cross-connector has a solder layer. The solder layer is preferably arranged at least on the side of the cross-connector facing away from the cell connection region. In particular, it is advantageous for the cell connector to be enveloped by solder. The provision of a solder layer has the advantage of the simpler solder process when interconnecting the solar cell with an adjacent solar cell in a module, in particular by a cell connector, preferably a cell connector ribbon. The solder layer is preferably formed from solder known per se; in particular, the solder layer preferably comprises one or more of the metals lead, tin, or silver.

The cell connector preferably has a thickness in the range of 20 µm to 1 mm, in particular in the range of 50 µm to 300 µm. This affords the advantage that no or only little bending of the cell connector is necessary when interconnecting the solar cell with an adjacent solar cell by a cell connector. Typical solar cells have a thickness in the range of 80 µm to 250 µm. Preferably, the cross-connector therefore likewise has a thickness in the range of 80 µm to 250 µm.

The cross-connector is preferably placed onto the cell connection region of the metal foil, in particular preferably onto the side of the cell connection region facing the front side of the solar cell. The cross-connector is preferably mechanically and electrically conductively connected to the cell connection region by the action of heat, in particular preferably by welding.

Preferably, the cross-connector is arranged at the metal foil during solar cell production and thus constitutes an integral part of the solar cell, such that during later module interconnection and arrangement of a plurality of solar cells in a row in order to form a module, the cross-connector is already situated in a manner arranged at the metal foil.

Advantageously, in order to form a solar cell module, the cross-connector of a solar cell is electrically conductively connected by a cell connector, in particular a cell connector ribbon, to an adjacent solar cell, in particular preferably to a metallic front-side contacting structure arranged at the front side of the adjacent solar cell. Preferably, the cell connector has a solder layer, such that a simple connection by soldering to the front-side contacting structure, on the one hand, and the cross-connector, on the other hand, is possible. In particular, it is advantageous to use a cell connector having a solder layer on one side, in particular a solder layer only on the side facing the front-side contacting structure and the cross-connector. Since, by virtue of the cross-connector, the cell connector does not have to be led onto the back side of the solar cell, the advantage is thus afforded that a coating with solder on one side is sufficient.

BRIEF DESCRIPTION OF THE DRAWINGS

Further advantageous features and embodiments are explained below with reference to figures and exemplary embodiments. In the figures here.

DETAILED DESCRIPTION

Figure 4:
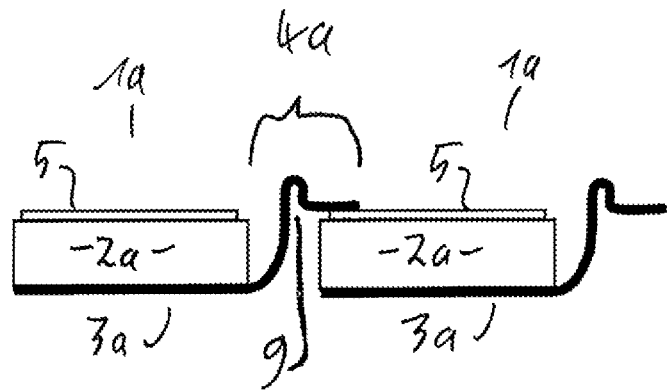
FIG. 4 shows a fourth exemplary embodiment with an expansion reserve.

In the figures, identical reference signs designate identical or identically acting elements. Schematic illustrations that are not true to scale are shown in the figures. In particular, the thickness of the solar cell and the metallization components thereof are considerably enlarged in relation to the width of the solar cell, for the sake of better illustration. As a result, the pitch angle of the shingle illustration in accordance with FIG. 4 is also considerably enlarged in the illustration. The row of solar cells continues analogously toward the right in order to form a solar cell string. On the right-hand solar cell in each case, the cell connection region of the metal foil has not been illustrated in plan view, for the sake of better clarity.

FIGS. 1A, 1B, 2A, 3A, 3B, 4, 5A, 6A, and 6B show side views, the top sides of the solar cell always being illustrated at the top. FIGS. 1C, 1D, 2B, 3C, 5B, and 6C show plan views from above.

Figure 1A:
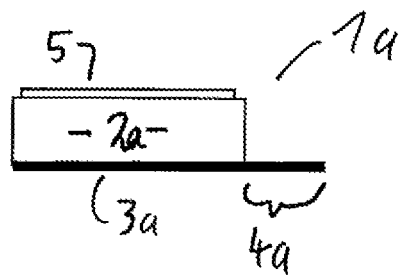
FIGS. 1A-1D show a first exemplary embodiment with a cell connection region for contacting the front side of an adjacent solar cell.

FIG. 1A schematically illustrates a first exemplary embodiment of a photovoltaic solar cell 1a according to the invention. The solar cell 1a comprises a semiconductor substrate 2a, which is formed as a p-doped silicon wafer and has an n-doped emitter, formed by diffusion, at the front side at the top. Furthermore, dielectric layers for passivation and for increasing the light absorption can be provided at the front side. In the present case, the front side is covered with a silicon nitride layer. A grid-shaped metallization structure known per se is arranged on the silicon nitride layer. Said structure is formed as a comblike metallization grid comprising busbars and metallization fingers that is known per se, and penetrates through the silicon nitride layer regionally in order to electrically contact the emitter. The back side is completely covered by an insulation layer formed as a 50 nm thick silicon oxide layer. A solar cell precursor having a base and a front-side emitter was thus provided in a method step A.

In one method step, a metal foil 3a is arranged at the back side, said metal foil being formed as an aluminum foil having a thickness of 20 µm in the present case.

The metal foil 3a is locally melted at a plurality of points by laser radiation, such that the locally melted metal penetrates through the silicon dioxide layer and silicon of the semiconductor substrate 2a is slightly melted as well in the region of the local heating by the laser beam. After solidification, at each location of the previous local heating there thus exists a point contact at which the metal foil 3a is mechanically and electrically conductively connected to the semiconductor substrate 2a and thus to the base of the photovoltaic solar cell. Furthermore, aluminum is locally incorporated in the semiconductor substrate 2a in each case at the region of the point contacts, said aluminum forming a so-called back surface field and reducing the charge carrier recombination in the contact region.

The metal foil 3a is formed in a manner completely covering the back side of the semiconductor substrate 2a. What is essential is that the metal foil, with a cell connection region 4a, projects beyond the edge of the solar cell precursor at the side illustrated on the right in FIG. 1A, in the present case by 2 cm.

Figure 1B:
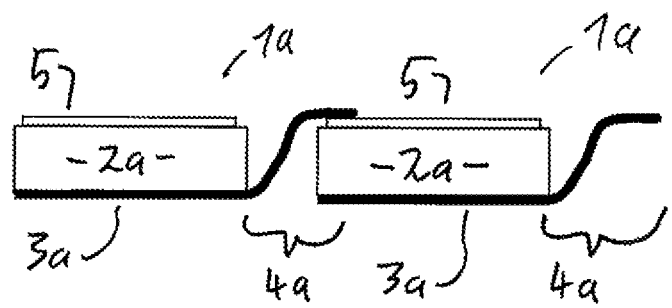

With this flexible cell connection region 4a of the metal foil 3a, the solar cell 1a can thus be interconnected in series interconnection with an adjacent solar cell in a photovoltaic module, as illustrated in FIG. 1B:

For this purpose, the cell connection region 4a is led between the two adjacent solar cells from the back side of the solar cell illustrated on the left to the front side of the solar cell illustrated on the right and, at the front side, is mechanically and electrically conductively connected to the metallic contacting structure of this solar cell by soldering, such that the two solar cells are interconnected in series. For this purpose, the solar cells 1a have a front-side metallization having a wide busbar in each case at an edge in order to connect said busbar in each case to the cell connection region 4a of the adjacent solar cell, as evident in the plan view in accordance with FIG. 1C:

In the plan view from above, the front-side metallization 5 applied on the front side is evident in each case for both solar cells, said front-side metallization having a wide busbar at the left-hand edge, proceeding from which busbar metallization fingers extend over the front side of the solar cell. The busbar of the front-side metallization 5 of the right-hand solar cell 1a is covered by the cell connection region 4a of the metal foil 3 of the left-hand solar cell 1a and is mechanically and electrically conductively connected to said cell connection region. This type of series interconnection continues along each line of solar cells (the so-called strings) in the photovoltaic module.

Figure 1C:
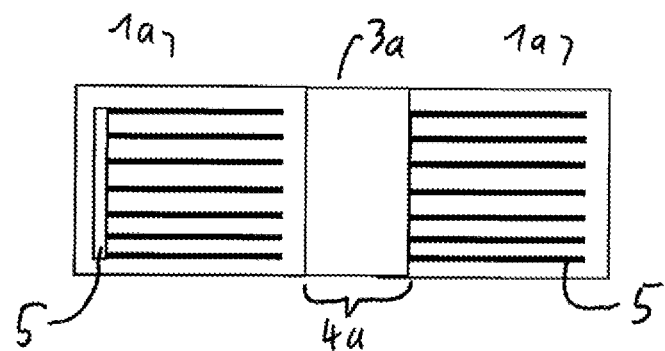
Figure 1D:
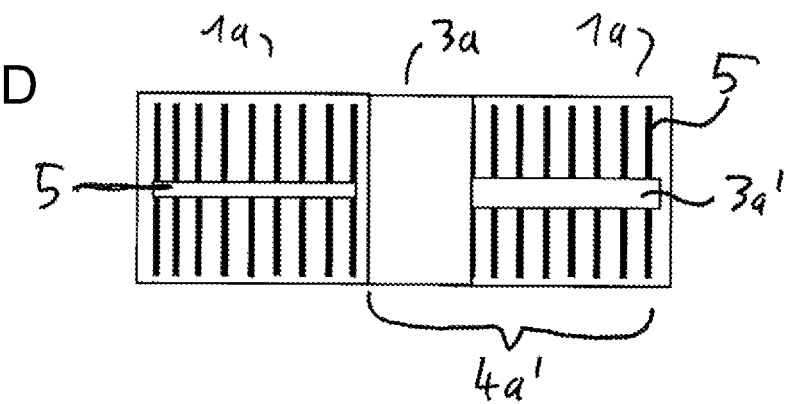

FIG. 1D illustrates an alternative exemplary embodiment, in which the front-side metallization has a central busbar extending in the direction of the row of solar cells. Accordingly, the cell connection region 4a' of the metal foil 3a has an elongate contacting finger extension 3a', which covers the busbar of the right-hand solar cell and is electrically conductively and mechanically connected to said busbar.

FIG. 1A thus shows a first exemplary embodiment of a photovoltaic solar cell according to the invention and the further figures each show an excerpt from an exemplary embodiment of a photovoltaic module according to the invention.

Figure 2A:
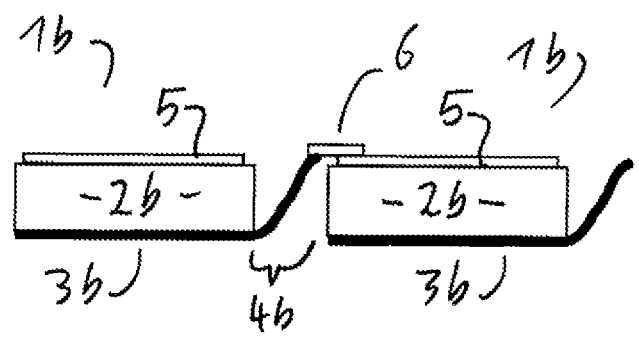
FIGS. 2A-2B show a second exemplary embodiment, in which a cell connection region formed a part of a cell connector.
Figure 2B:
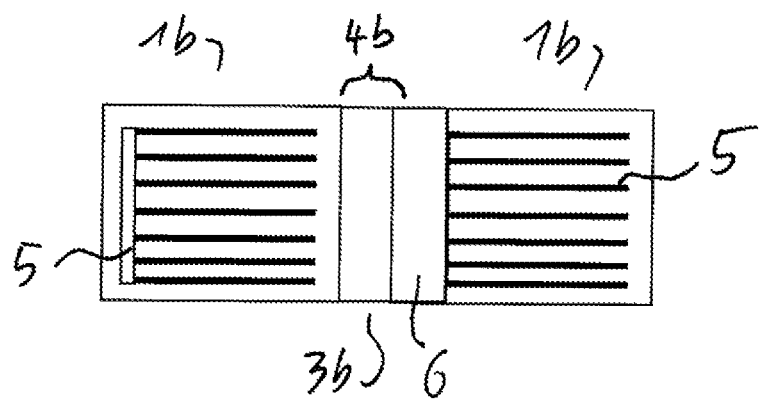

The second exemplary embodiment in accordance with FIGS. 2A-2B is identical to the first exemplary embodiment in terms of basic principles. In order to avoid repetition, therefore, only the essential differences are discussed below:

As evident in FIG. 2A, the solar cell 1b comprising semiconductor substrate 2b and metal foil 3b differs from the first exemplary embodiment in that the cell connection region 4b is formed in a narrower fashion, 1 cm in the present case, compared with the cell connection region 4a. This stems from the different type of interconnection:

As evident in FIG. 2A, a cell connector 6 formed as a metal plate is arranged at a front-side metallization of the solar cell 1b illustrated on the right. Said cell connector has a thickness of 200 μm and is not flexible. The cell connector 6 was arranged at the front-side metallization of the solar cell 1b illustrated on the right by soldering. The cell connection region 4b of the solar cell 1b illustrated on the left is connected to the underside of the cell connector 6 by soldering.

This type of interconnection has the advantage that, firstly, half of the otherwise customary cell connectors can be saved and, secondly, connection processes that are more energy-intensive, such as hard soldering or welding, can be used in the cell interspaces, which processes enable connection locations of higher quality. A further advantage is that the cell connector soldered on the front side of the right-hand cell only has to have a solder layer formed at the side facing the right-hand cell. In the traditional production of strings, the cell connector requires solder at the opposite side, too, since the latter faces the back side of the left-hand solar cell. The foil interconnection thus makes it possible to use simpler cell connector ribbons.

FIG. 2B illustrates a plan view from above, wherein for both solar cells in each case the front-side metallization was not rendered, for the sake of better clarity.

Figure 3A:
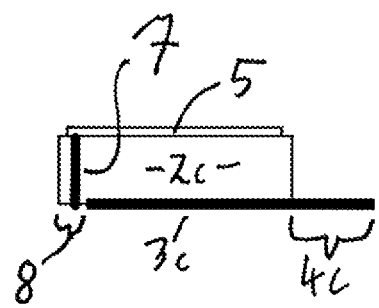
FIGS. 3A-3C show a third exemplary embodiment with MWT solar cells.
Figure 3B:
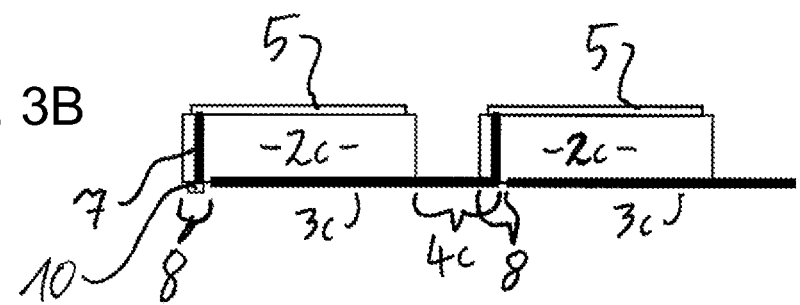
Figure 3C:
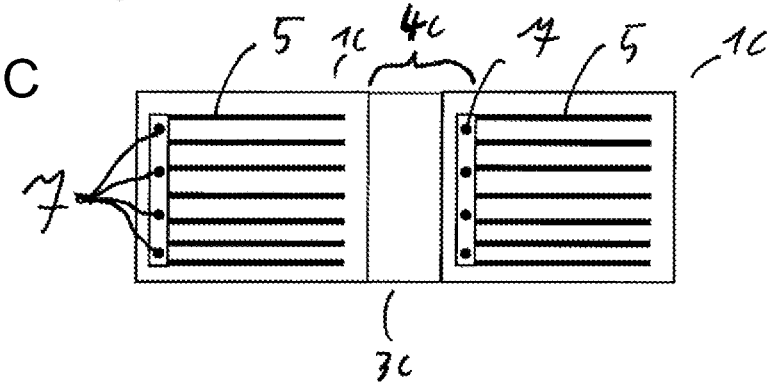

FIGS. 3A-3C illustrate a third exemplary embodiment, in which a series interconnection of the solar cells is possible exclusively by way of back-side contacting:

The solar cell 1c is identical in its basic construction to the solar cell described and illustrated in accordance with FIG. 1A. Here, however, the solar cell is formed as an MWT solar cell. The solar cell comprises metallic via structures at the left-hand edge. These metallic via structures 7 connect a front-side metallization of the solar cell to the back side of the solar cell.

Accordingly, the back side of the solar cell has a connection edge region 8, which is not covered by the metal foil 3c. The connection edge region 8 has a width of 0.5 cm.

This is necessary since the metal foil 3c is electrically conductively connected to the base of the solar cell and the via structure 7 is electrically conductively connected to the emitter of the solar cell by way of the front-side metallization.

A purely back-side series interconnection can be achieved in this way, as illustrated in FIG. 3B:

The cell connection region 4c of the metal foil 3c of the solar cell 1c illustrated on the left covers the via structure 7 of the solar cell 1c illustrated on the right in the connection edge region 8 of the solar cell illustrated on the right and is electrically conductively connected to the via structure 7. As a result, a series interconnection is achieved, without the cell connection region 4c having to be led between the solar cells from the back side to the front side.

In this illustration, a metallic initial contacting structure 10 in the connection edge region 8 is illustrated at the via structure 7 in the case of the left-hand solar cell 1c, said initial contacting structure being connected to external terminals of the photovoltaic module by a cable or some other conductor.

FIG. 4 shows a further exemplary embodiment, which constitutes a modification of the exemplary embodiment in accordance with FIGS. 1A to 1C:

Proceeding from the state in accordance with FIGS. 1B and 1C, the solar cells 1a are brought closer together by 200 μm, with the result that an expansion reserve 9 forms in the cell connection region 4a between the solar cells 1a. In this configuration, the solar cells are fixed in the solar cell module, such that in the event of a possible expansion as a result of temperature fluctuations, for example, there is an expansion reserve, which avoids a mechanical loading in the cell connection region 4a.

Figure 5A:
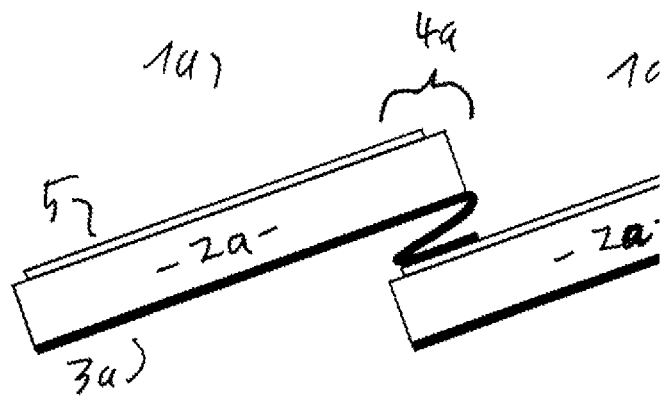
FIGS. 5A-5B show a fifth exemplary embodiment using shingle technology.
Figure 5B:
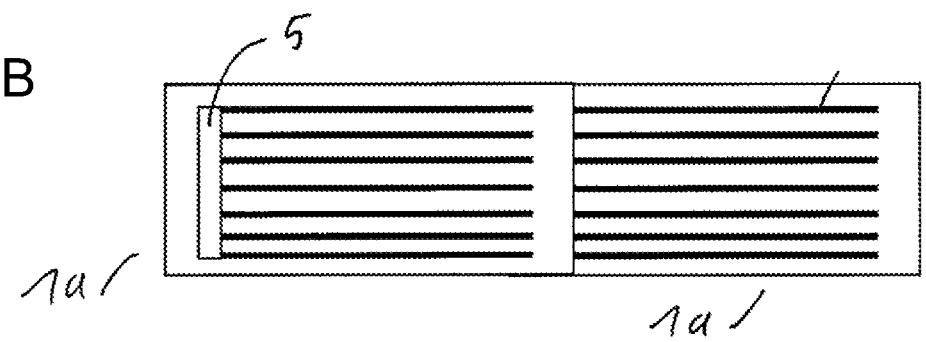

FIGS. 5A-5B illustrate a further exemplary embodiment, likewise proceeding from the state in accordance with FIGS. 1B and 1C. In this exemplary embodiment, an arrangement using shingle technology is realized by virtue of the left-hand solar cell 1a being raised and being placed over the edge of the right-hand solar cell 1a. Due to the flexible metal foil, a folding can be formed in the cell connection region 4a in this case, see FIG. 5A. The covering is effected in such a way that, in a plan view from above, no metal foil 3a is evident and, consequently, no shading by the metal foil is effected either and a higher module efficiency can be achieved (see FIG. 5B).

Figure 6A:
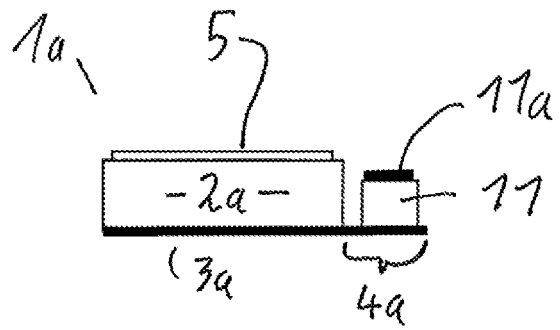
FIGS. 6A-6C show a sixth exemplary embodiment with a cross-connector.
Figure 6B:
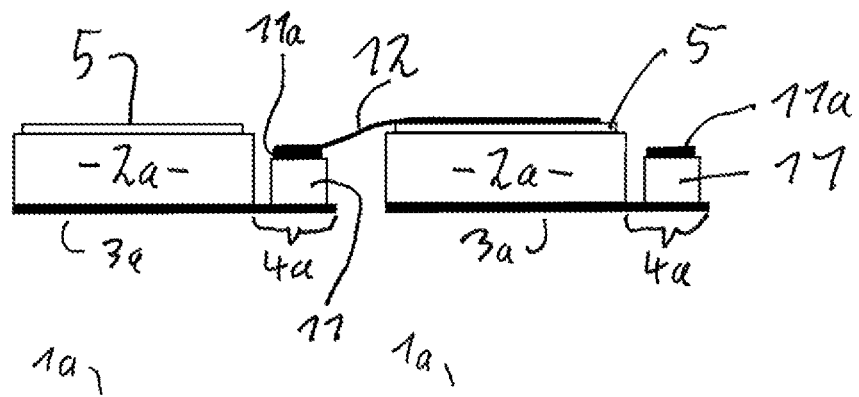
Figure 6C:
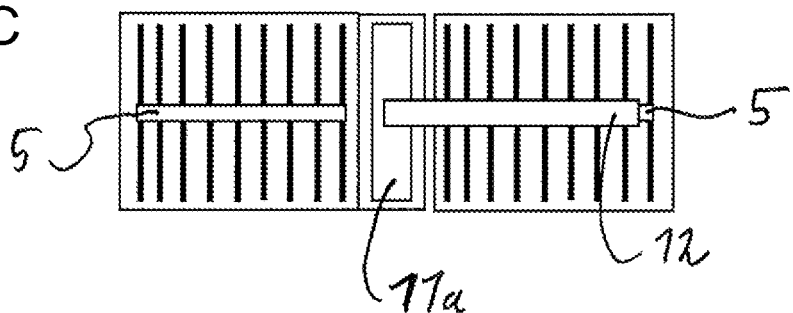

FIGS. 6A-6C illustrate a sixth exemplary embodiment with a cross-connector.

FIG. 6A shows a sixth exemplary embodiment of a photovoltaic solar cell according to the invention. The photovoltaic solar cell is formed substantially in accordance with the exemplary embodiment described and illustrated in FIGS. 1A-1D, comprising semiconductor substrate 2a, metal foil 3a, cell connection region 4a and front-side metallization 5.

In addition, in this exemplary embodiment, the solar cell comprises a cross-connector 11. The cross-connector is formed from copper and is welded to the metal foil 3a at the side of the cell connection region 4a facing the front side of the solar cell. This results in a mechanical and electrically conductive connection. The cross-connector has a lead-containing solder layer 11a at the side facing away from the cell connection region.

As evident in the plan view in accordance with FIG. 6C, the cross-connector 11 has an elongate shape having an approximately rectangular base area and extends parallel to the edge of the solar cell precursor at which the cell connection region 4a is arranged, i.e. in a parallel longitudinal extent from top to bottom in the illustration in accordance with FIG. 6C.

The cross-connector 11 is arranged on the metal foil 3a at a distance from the solar cell precursor and, in particular, the semiconductor substrate 2a.

In order to interconnect a plurality of solar cells in a module, in a manner known per se, a cell connector formed as a metallic cell connector ribbon 12 is applied firstly to the cross-connector 11 by soldering and secondly to a busbar of the front-side metallization 5 of the adjacent cell likewise by soldering.

This affords the advantage that production installations and method steps known per se and also cell connector ribbons known per se can be used in order to electrically conductively connect the solar cells by soldering for the production of a photovoltaic module, in particular in a series circuit. Considerable simplifications result, however, since both for connecting the cell connector ribbon 12 to the front-side metallization 5 and for connecting the cell connector ribbon 12 to the cross-connector 11, soldering from above, i.e. coming from the front side of the solar cell, is possible in each case.

The cell connector ribbon 12 is coated with lead-containing solder on one side, at the side facing the front-side metallization 5 and the solder layer 11a of the cross-connector 11. In contrast to cell connectors completely enveloped by solder, it is thus possible for solder to be saved.

As evident in FIG. 6B, the cross-connector with solder layer has a thickness that approximately corresponds to the thickness of the solar cell 1a. In the present case, the solar cell 1a has a thickness of approximately 200 µm and the cross-connector has a thickness of approximately 180 µm. This affords the advantage that connecting the solar cells necessitates only a small degree of bending of the cell connector ribbon 12.

The invention claimed is:

1. A method for producing a photovoltaic solar cell (1a, 1b, 1c) comprising the following steps:
   A. providing at least one solar cell precursor having at least one base and at least one emitter;
   B. arranging a metal foil (3a, 3b, 3c) at a back side of the solar cell precursor, such that the metal foil (3a, 3b, 3c) is electrically conductively connected to the base or the emitter, wherein the metal foil (3a, 3b, 3c) is formed as an integral part of the back-side contacting and terminating the solar cell (1a, 1b, 1c) at the back side;
   wherein the arranging of the metal foil (3a, 3b, 3c) includes the metal foil projecting beyond an edge of the solar cell precursor with at least one cell connection region (4a, 4b, 4c) at at least one side by at least 200 µm, and folding the metal foil projecting beyond the edge of the solar cell precursor back under an edge region of the solar cell precursor in a Z-shape.

2. The method as claimed in claim 1, wherein the metal foil is a monolayer metal foil (3a, 3b, 3c).

3. The method as claimed in claim 1, wherein the metal foil (3a, 3b, 3c) is electrically conductively connected to the solar cell precursor via a plurality of point contacts, the method further comprising:
   arranging at least one electrically insulating insulation layer between metal foil (3a, 3b, 3c) and solar cell precursor, said insulation layer having a plurality of openings, at each of which an electrically conductive connection between metal foil (3a, 3b, 3c) and solar cell precursor is formed, and
   electrically connecting the plurality of point contacts to one another outside the solar cell precursor exclusively via the metal foil (3a, 3b, 3c).

4. The method as claimed in claim 1, wherein the metal foil (3a, 3b, 3c) completely covers the back side of the solar cell precursor.

5. The method as claimed in claim 1, wherein the metal foil (3a, 3b, 3c) is arranged in a manner omitting a connection edge region (8) of the back side.

6. The method as claimed in claim 5, further comprising forming at least one metallic through connection from a front side to the back side of the solar cell precursor in the connection edge region (8), which is not covered by the metal foil (3a, 3b, 3c).

7. The method as claimed in claim 1, further comprising forming the cell connection region (4a, 4b, 4c) with at least one elongate contacting finger extension at a side of the cell connection region facing away from the solar cell precursor.

8. The method as claimed in claim 1, further comprising electrically conductively connecting at least one electrically conductive cross-connector (11) to the cell connection region (4a), with the cross-connector (11) being arranged on the side of the cell connection region (4a) facing a front side of the solar cell.

* * * * *